(12) United States Patent
Monde et al.

(10) Patent No.: US 11,494,525 B2
(45) Date of Patent: Nov. 8, 2022

(54) METHOD FOR ANALYZING HEAT EXCHANGER

(71) Applicant: MITSUBISHI HEAVY INDUSTRIES, LTD., Tokyo (JP)

(72) Inventors: Masatsugu Monde, Tokyo (JP); Naoki Ono, Tokyo (JP); Tomohito Nakamori, Tokyo (JP); Masaaki Katayama, Tokyo (JP); Ryoichi Kawakami, Tokyo (JP); Masahito Matsubara, Tokyo (JP); Tomonori Mineno, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 738 days.

(21) Appl. No.: 16/475,188

(22) PCT Filed: Oct. 23, 2017

(86) PCT No.: PCT/JP2017/038192
§ 371 (c)(1),
(2) Date: Jul. 1, 2019

(87) PCT Pub. No.: WO2018/135058
PCT Pub. Date: Jul. 26, 2018

(65) Prior Publication Data
US 2019/0340307 A1    Nov. 7, 2019

(30) Foreign Application Priority Data
Jan. 20, 2017    (JP) .............................. JP2017-008517

(51) Int. Cl.
   *G01N 3/32*     (2006.01)
   *G06F 30/00*    (2020.01)

(52) U.S. Cl.
   CPC ............... *G06F 30/00* (2020.01); *G01N 3/32* (2013.01); *G01N 2203/0073* (2013.01); *G01N 2203/0226* (2013.01); *G01N 2203/0232* (2013.01)

(58) Field of Classification Search
CPC .................................. G01N 3/32; G06F 30/00
See application file for complete search history.

(56) References Cited

U.S. PATENT DOCUMENTS

2011/0277554 A1 * 11/2011 Ogawa ..................... F22B 37/20
                                                  73/818
2019/0018921 A1 * 1/2019 Iwasaki ..................... G06F 30/13

FOREIGN PATENT DOCUMENTS

JP    2014-109906 A    6/2014
JP    2014-164323 A    9/2014

(Continued)

OTHER PUBLICATIONS

International Search Report dated Dec. 5, 2017, issued in counterpart application No. PCT/JP2017/038192, with English translation. (4 pages).

(Continued)

*Primary Examiner* — Bryan Bui
(74) *Attorney, Agent, or Firm* — WHDA, LLP

(57) ABSTRACT

A method for analyzing a heat exchanger includes a structural model creation step (S1) of creating a structural model of a heat exchanger; a iron-linear model creation step (S4) of creating a iron-linear model in which a non-linear spring element in an out-of-plane direction, in which a load is generated only at me time of contact between a heat transfer tube and an anti-vibration member, is applied to an opposing portion between the heat transfer tube and the anti-vibration member in a structural model, and a load distribution acquisition step (S5) of performing analysis in which a load in the out-of-plane direction is applied to the non-linear (Continued)

model to acquire load distribution of the heat exchanger from a value of the load in each opposing portion.

4 Claims, 9 Drawing Sheets

(56) References Cited

FOREIGN PATENT DOCUMENTS

| | | |
|---|---|---|
| JP | 2015-026259 A | 2/2015 |
| JP | 2017-049013 A | 3/2017 |

OTHER PUBLICATIONS

Written Opinion dated Dec. 5, 2017, issued in counterpart application No. PCT/JP2017/038192, with English translation. (9 pages).
Tomonori Mineno et al., "Development of seismic analysis at U-bend tube-bundle of steam generator", The Proceedings of the 2015 Materials and Mechanics Conference, Nov. 20, 2015, OS0921-265, cited in ISR dated Dec. 5, 2017. (3 pages).
Hassan, Marwan et al., "A Numerical Characterization of Flow-Induced Vibration and Fretting Wear Potential in Nuclear Steam Generator Tube Bundles", ASME 2011 Pressure Vessels and Piping Conference PVP2011 Jul. 17-21, 2011, Baltimore, Maryland, USA, vol. 4, Jul. 21, 2011 (Jul. 21, 2011), pp. 141-149, XP055585285, US DOI: 10.1115/PVP2011-57182, ISBN: 978-0-7918-4454-0; Cited in European Search Report dated Dec. 13, 2019. (10 pages).
Rubiolo et al. "Probabilistic prediction of fretting-wear damage of nuclear fuel rods", Nuclear Enginnering and Design, Amsterdam, NL, vol. 236, No. 14-16, Aug. 1, 2006 (Aug. 1, 2006), pp. 1628-1640, XP028080197, ISSN: 0029-5493, DOI: 10.1016/J.NUCENGDES.2006.04.023; Cited in European Search Report dated Dec. 13, 2019. (13 pages).

\* cited by examiner

METHOD FOR ANALYZING HEAT EXCHANGER

TECHNICAL FIELD

The present invention relates to a method for analyzing a heat exchanger.

Priority is claimed on Japanese Patent Application No. 2017-008517, filed on Jan. 20, 2017, the content of which is incorporated herein by reference.

BACKGROUND ART

A steam generator includes a heat exchanger having a U-bend portion. The U-bend portion of the heat exchanger is formed by collectively arranging a plurality of heat transfer tubes, each of which has a bend portion, to form a hemispherical shape as a whole. Specifically, the U-bend portion is configured by stacking heat transfer tube groups arranged side by side in the same plane (in-plane direction) in an out-of-plane direction orthogonal to the in-plane direction. An anti-vibration member which extends to intersect each of the heat transfer tubes is disposed between such heat transfer tube groups.

For example, a method of predicting vibration of the heat transfer tubes of the steam generator is disclosed in Patent Document 1.

CITATION LIST

Patent Literature (Patent Document 1) Japanese Unexamined Patent Application, First Publication No. 2015-26259

SUMMARY OF INVENTION

Technical Problem

Although normally the heat transfer rubes and the anti-vibration members of the heat exchanger are somewhat in contact with each other due to variations at the time of manufacturing at normal times, the heat transfer tubes and the anti-vibration members do not exert a high load on each other. However, by the entire heat exchanger significantly deforming at the time of an earthquake, the heat transfer tubes and the anti-vibration members exert a high load on each other. Accordingly, the entire heat exchanger is divided into a portion in which a load is generated and a region in which there is a gap. In order to improve the accuracy of seismic evaluation of the steam generator, it is necessary to learn the behavior of such heat transfer tubes and such anti-vibration members, and to acquire load distribution and gap distribution of the entire heat exchanger.

The present invention is devised in view of such problems, and an object thereof is to provide a method for analyzing a heat exchanger, in which the accuracy of seismic evaluation can be improved.

Solution to Problem

In order to solve the problems, the present invention adopts the following means.

According to an aspect of the present invention, there is provided a method for analyzing a heat exchanger having a heat exchanger main body formed by a plurality of heat transfer tube groups, each of which is formed of a plurality of heat transfer tubes arranged side by side in an in-plane direction, being stacked in an out-of-plane direction intersecting the in-plane direction and an anti-vibration member provided between the heat transfer tube groups adjacent to each other to extend to intersect the heat transfer tubes. The method for analyzing a heat exchanger includes a structural model creation step of creating a structural model of the heat exchanger, a non-linear model creation step of creating a non-linear model in which a non-linear spring element in the out-of-plane direction, in which a load is not generated at the time of non-contact between the heat transfer tube and the anti-vibration member and a load is generated at the time of contact, is applied to each opposing portion between the heat transfer tube and the anti-vibration member in the out-of-plane direction in the structural model, and a load distribution acquisition step of performing analysis in which the load in the out-of-plane direction is applied to the non-linear model to acquire load distribution of the heat exchanger from a value of the load in each of the opposing portions.

In such a method for analyzing, distribution of the load exerted by the heat transfer tube and the anti-vibration member on each other and distribution of a gap between the heat transfer tube and the anti-vibration member can be learned by performing analysis with an analysis model to which the non-linear spring simulating the behavior of the heat transfer tube and the anti-vibration member is applied. Thus, the accuracy of seismic evaluation can be improved by performing response analysis in consideration of such load distribution and such gap distribution.

In addition, it is preferable that the method for analyzing a heat exchanger according to the aspect of the present invention further include a linear gap model creation step of creating a linear gap model in which a linear spring element in the out-of-plane direction is applied to only the opposing portion in which the load is generated, out of the opposing portions of the structural model, according to the load distribution and a seismic evaluation step of performing seismic evaluation by using the linear gap model.

Herein, if the linear spring element is applied to all of the opposing portions between the heat transfer tubes and the anti-vibration members in the structural model, a tension load is generated in some cases even in a case where the gap is generated between the heat transfer tube and the anti-vibration member. For this reason, behavior different from the actual behavior of the heat exchanger, in which the gap is generated between the heat transfer tube and the anti-vibration member is shown.

In the method for analyzing according to the embodiment, according to the load distribution or the gap distribution, the linear spring element is not applied to a portion in which a load is 0, that is, a portion in non-contact, out of the opposing portions between the heat transfer tubes and the anti-vibration members, and the linear spring element is applied to only a portion in which a load is generated. Accordingly, behavior closer to the actual behavior of the heat transfer tubes and the anti-vibration members of the heat exchanger can be simulated.

In addition, since the linear gap model, which is an analysis target, does not include the non-linear element at the time of response analysis of performing dynamic analysis in which a seismic wave is applied, analysis time is not extended.

In the linear gap model creation step of the method for analyzing a heat exchanger according to the aspect of the present invention, the linear gap model may be created by applying a linear spring element in the in-plane direction to each of the opposing portions in the structural model using a value according to the load of each of the opposing portions as elastic stiffness.

Accordingly, friction exerted by the heat transfer tube and the anti-vibration member on each other in the in-plane direction can be simulated. Therefore, analysis approximating to the more actual behavior of the heat exchanger can be performed.

In the method for analyzing a heat exchanger according to the aspect of the present invention, a linear model creation step of creating a linear model in which a linear spring element in the out-of-plane direction is applied to all of the opposing portions of the structural model and a primary response analysis step of performing response analysis in which a seismic wave is applied to the linear model to acquire a deformation amount of the linear model may be further included. In the load distribution acquisition step, a load may be applied to the non-linear model such that a deformation amount of the non-linear model becomes a value corresponding to the deformation amount acquired in the primary response analysis step.

Accordingly, the analysis can be smoothly performed while simulating the behavior of the heat transfer tube and the anti-vibration member when the seismic wave is applied to the heat exchanger.

That is, in the present invention, the linear model to which only the linear element is applied is used in dynamic analysis in which the seismic wave is applied, and the non-linear model to which the non-linear element is applied is used in static analysis in which the load is applied.

For this reason, an analysis result approximating to the actual behavior of the heat transfer tube and the anti-vibration member can be acquired while suppressing the careless extension of analysis time.

Advantageous Effects of Invention

In the present invention, the accuracy of seismic evaluation can be unproved.

DESCRIPTION OF EMBODIMENTS

First Embodiment

Hereinafter, a method for analyzing a heat exchanger of the present invention will be described in detail with reference to the drawings.

Figure 1:
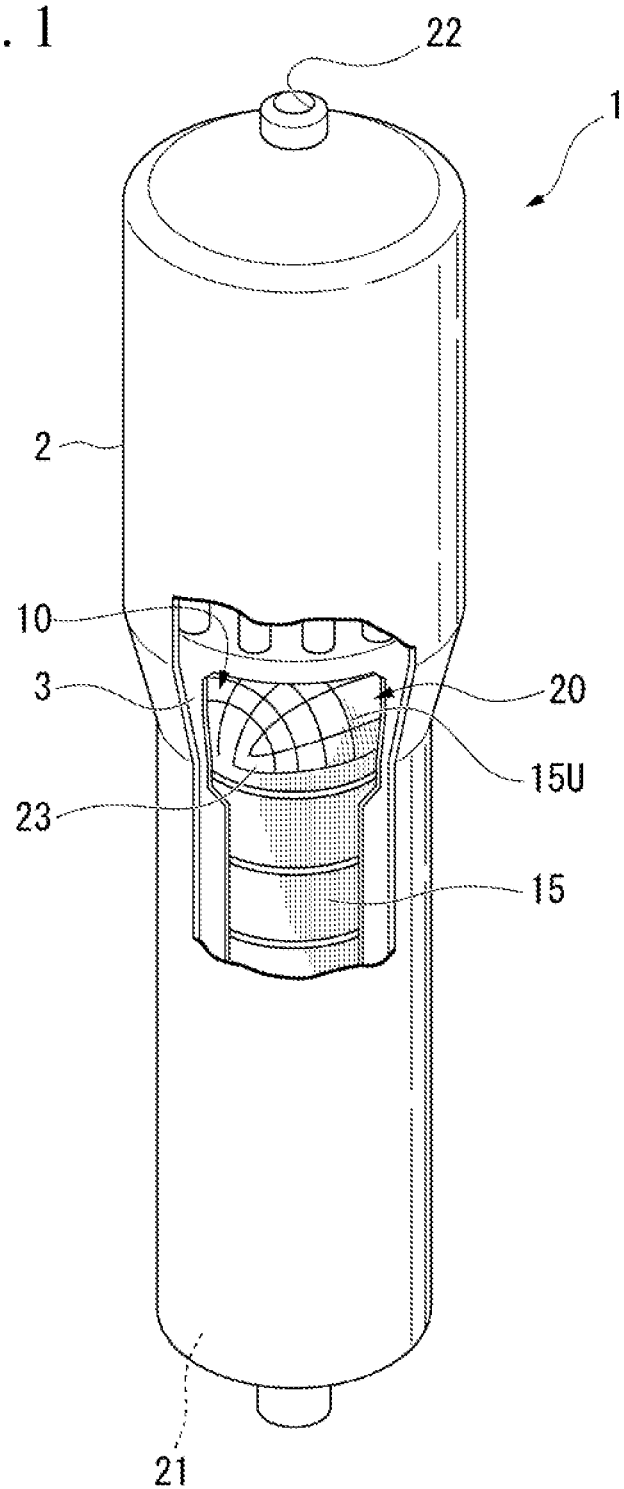
FIG. 1 is a partially broken perspective view of a steam generator according to a first embodiment.

A steam generator 1 including a heat exchanger shown in FIG. 1, which is an analysis target, is used in, for example, a pressurized water reactor (PWR). The pressurized water reactor uses light water as a reactor coolant and a neutron moderator, and uses the light water as a primary coolant. The pressurized water reactor sends the primary coolant to the steam generator 1 as high-temperature and high-pressure water that does not boil over the entire reactor core.

The steam generator 1 shown in FIG. 1 includes a drum unit 2 that extends in an up-and-down direction, has a sealed hollow cylindrical shape, and has a lower-half portion having a smaller diameter than an upper-half portion. A water chamber 21 is disposed on a lower end side of the drum unit 2, and a steam discharge port 22 is disposed on an upper end side thereof. In a region ranging from the lower-half portion to the upper-half portion, a cylindrical tube group outer shell (wrapper tube) 3 arranged at an interval to an inner wall surface of the drum unit 2 is provided. A lower end portion of the tube group outer shell 3 extends to a tube plate (not shown) disposed below the lower-half portion of the drum unit 2. A heat exchanger 20 that has a plurality of heat transfer tubes 15 is provided in the tube group outer shell 3.

The heat exchanger 20 has a U-bend portion 10. The U-bend portion 10 is arranged such that the plurality of heat transfer tubes 15 are formed in a hemispherical shape as a whole. Each of the heat transfer tubes 15 has a bend portion 15U. That is, the U-bend portion 10 that has a hemispherical shape as a whole by the bend portions 15U being arranged to overlap each other is formed.

Figure 2:
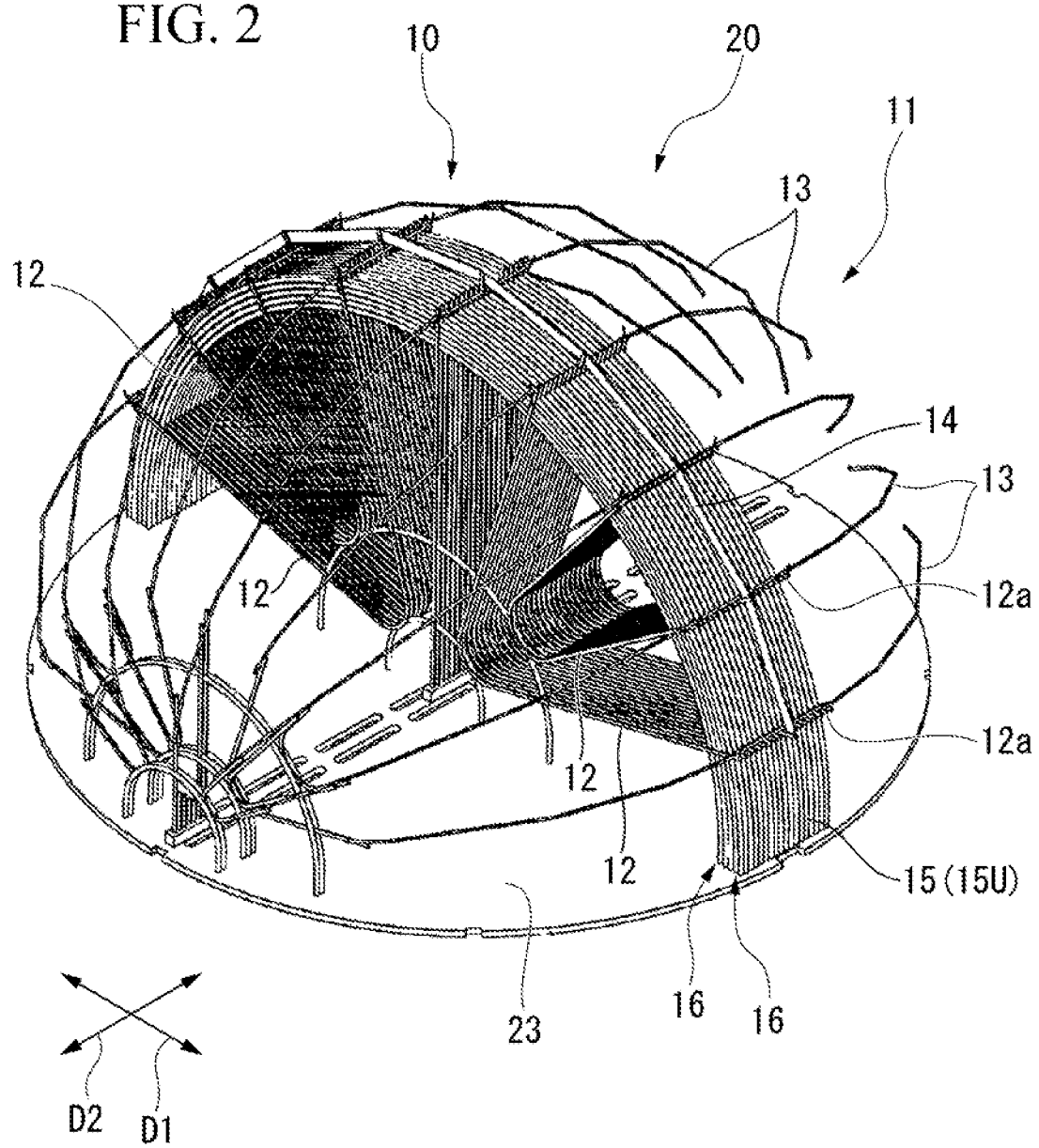
FIG. 2 is a perspective view of a U-bend portion of the steam generator according to the first embodiment.
Figure 3:
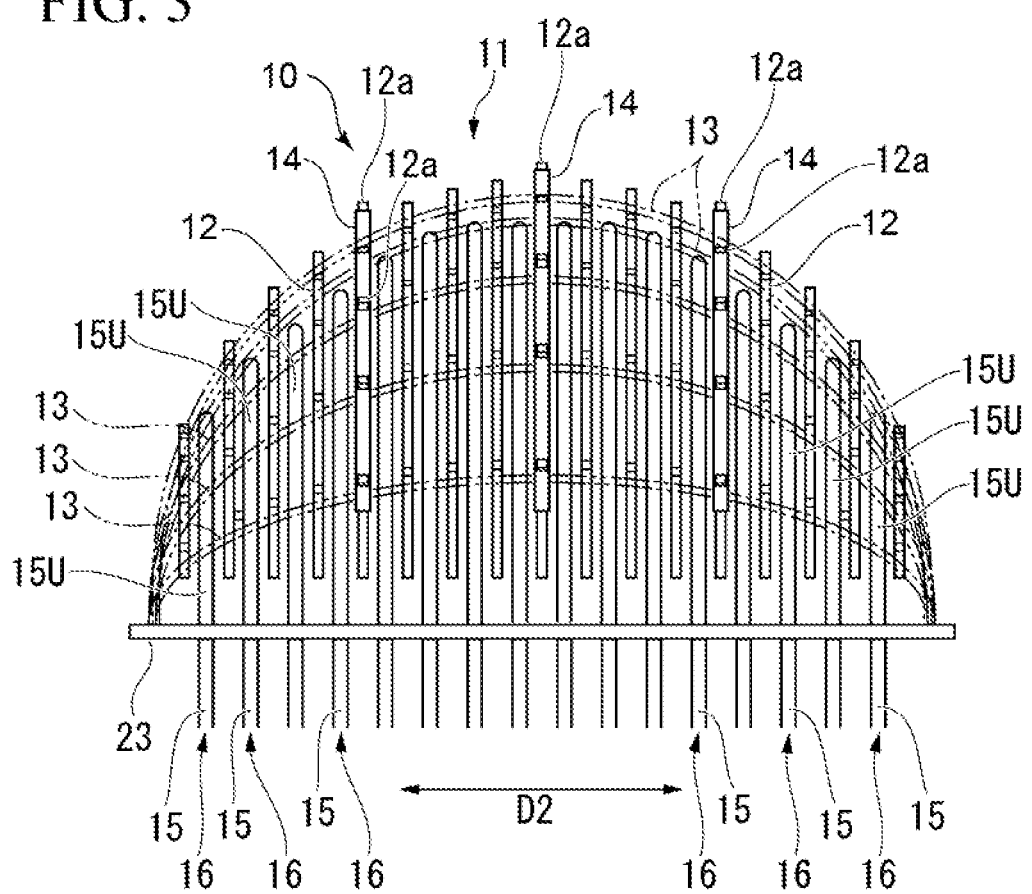
FIG. 3 is a side view of the U-bend portion of the steam generator according to the first embodiment, which is seen in an in-plane direction.
Figure 4:
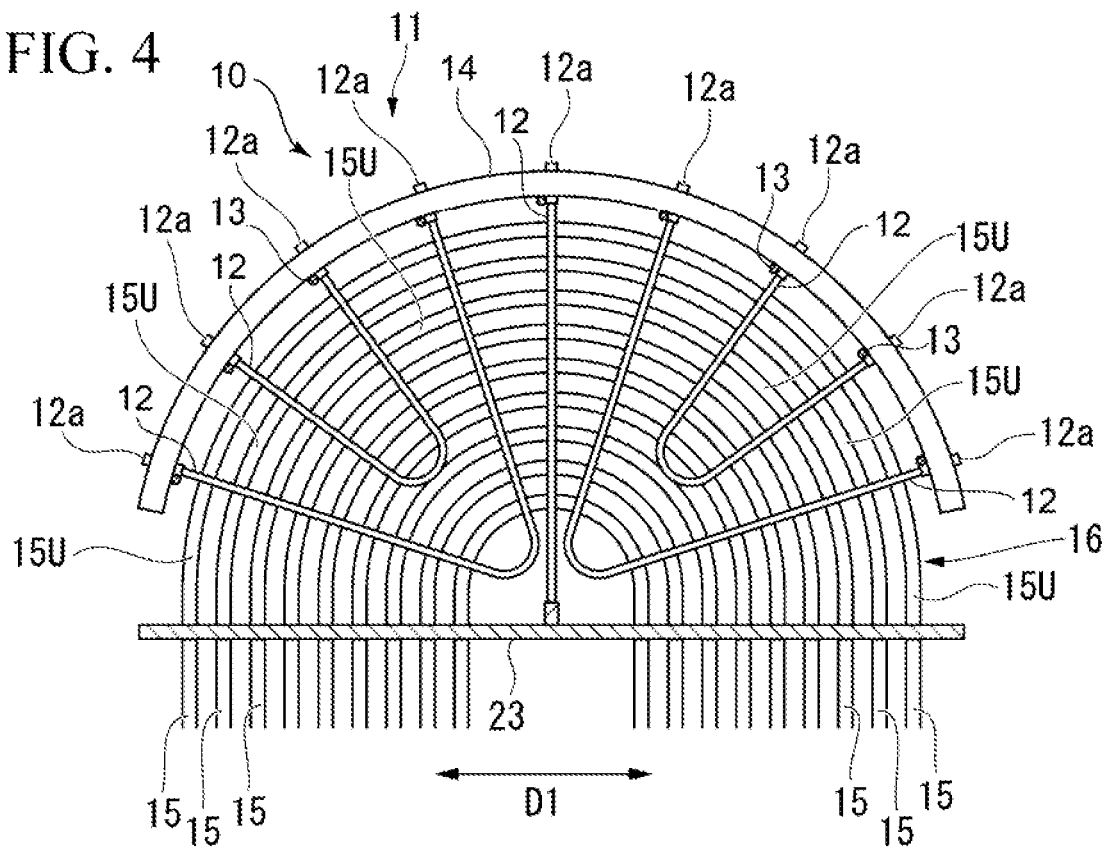
FIG. 4 is a longitudinal sectional view of the U-bend portion of the steam generator according to the first embodiment, which is seen in an out-of-plane direction.

More specifically, the heat exchanger 20 includes a heat exchanger main body 11, anti-vibration members 12, and holding members 13, and bridges 14, as shown in FIG. 2 to FIG. 4. The heat exchanger main body 11 is configured by stacking a plurality of heat transfer tube groups 16 in an out-of-plane direction D2 orthogonal to an in-plane direction D1. The plurality of heat transfer tube groups 16 are configured with the plurality of heat transfer tubes 15 arranged side by side in the same plane (the in-plane direction D1).

Each of the heat transfer tubes 15 is a tubular member, and has a pair of linear portions to which lower ends each are connected to the water chamber 21 shown in FIG. 1 and the bend portion 15U that connects upper end portions of the linear portions to each other.

Each of the heat transfer tube groups 16 is configured by arranging the plurality of heat transfer tubes 15, which have the bend portions 15U having different sizes from each other, toward an outer side of the bend portion 15U in increasing order of a diameter of each of the bend portions 15U. At this time, the linear portions of each of the heat transfer tubes 15 are parallel to each other. Accordingly, the heat transfer tube groups 16 that have the plurality of heat transfer tubes 15 arranged in the same plane are formed as described above. The in-plane direction D1 means a direction along a plane in which the heat transfer tubes 15 of each of the heat transfer tube groups 16 are disposed.

The heat exchanger main body 11 is configured by stacking the plurality of heat transfer tube groups 16 in the out-of-plane direction D2 orthogonal to the in-plane direction D1. The out-of-plane direction D2 may be a direction intersecting the in-plane direction D1 instead of the direction orthogonal to the in-plane direction.

By stacking the heat transfer tube groups 16 in such a manner, the U-bend portion, in which the plurality of bend portions 15U form a hemispherical shape as a whole, is formed in a top portion of the heat exchanger main body 11. The U-bend portion 10 is disposed to lace an upper side of the heat exchanger 20.

Such a heat exchanger main body 11 is supported by a tube support plate 23 fixed to an inner side of the drum unit 2. That is, multiple through-holes are formed in the tube support plate, and each of the heat transfer tubes 15 is inserted in each of the through-holes in a non-contact state. In other words, the plurality of heat transfer rubes 15 of each of the heat transfer tube groups 16 are disposed such that a gap is formed between the other adjacent heat transfer tubes 13.

The anti-vibration member 12 is provided in each area between the heat transfer tube groups 16 stacked in the out-of-plane direction D2. That is, the anti-vibration member 12 is provided in each gap formed between the heat transfer tube groups adjacent to each other.

The anti-vibration member 12 is a rod-like member in an I-shape or a V-shape as a whole, which has a rectangular section. Fixing portions 12a are provided at both end portions of the anti-vibration member 12. The I-shaped anti-vibration member 12 is disposed in a middle portion of the U-bend portion 10. Between the stacked heat transfer tube groups 16, the V-shaped anti-vibration member 12 has a V-shaped top portion positioned on a center side of a hemisphere formed by the U-bend portion 10. Due to such a configuration, the anti-vibration member 12 extends in the in-plane direction D1 to be interposed between the adjacent heat transfer tube groups 16 in the out-of-plane direction D2.

The holding member 13 is a member that connects the fixing portions 12a of the anti-vibration members 12, which protrude from a surface of the U-bend portion 10, to each other. The holding member 13 has an arc shape extending along a hemispheric surface of the U-bend portion 10.

The bridge 14 is connected to each of the plurality of anti-vibration members 12 provided at intervals in the out-of-plane direction D2. Herein, the fixing portions 12a of some of the anti-vibration members 12 protrude more to a radially outer side of the hemispheric surface than the fixing portions 12a of the other anti-vibration members 12 do. To the protruding portions, the bridge 14 is connected. In such a manner, the bridge 14 and the anti-vibration members 12 are connected to each other.

The bridge 14 is an arc-shaped member disposed to extend in the in-plane direction D1 along an outer circumference of the U-bend portion 10, that is, a hemispherical outer circumference of the heat transfer tube group 16. Although only one bridge 14 is shown in FIG. 2, in reality, the plurality of bridges 14 are disposed at intervals in the out-of-plane direction D2 as shown in FIG. 3.

In the steam generator 1 configured in such manner, primary cooling water heated by the pressurized water reactor is sent to an entrance of the water chamber 21, passes and circulates through the multiple beat transfer tubes 15 of the heat exchanger main body 11, and reaches an exit of the water chamber 21, as shown in FIG. 1. On the contrary, secondary cooling water cooled by a condenser is sent to a water supply tube, passes through a water supply passage in the drum unit 2, and rises along the heat transfer tube groups 16. At this time, heat exchanged between high-temperature primary cooling water flowing in the heat transfer tubes 15 and secondary cooling water around the heat transfer tubes 15. The primary cooling water cooled through the heat exchange returns to an inside of the pressurized water reactor from the exit. On the contrary, the secondary cooling water which has exchanged heat with the high-temperature and high-pressure primary cooling water rises in the drum unit 2, and is separated into steam and hot water by a steam-water separator. The steam which is separated out is sent to a turbine after a moisture separator removes moisture.

<Method for Analyzing Heat Exchanger>

Figure 5:
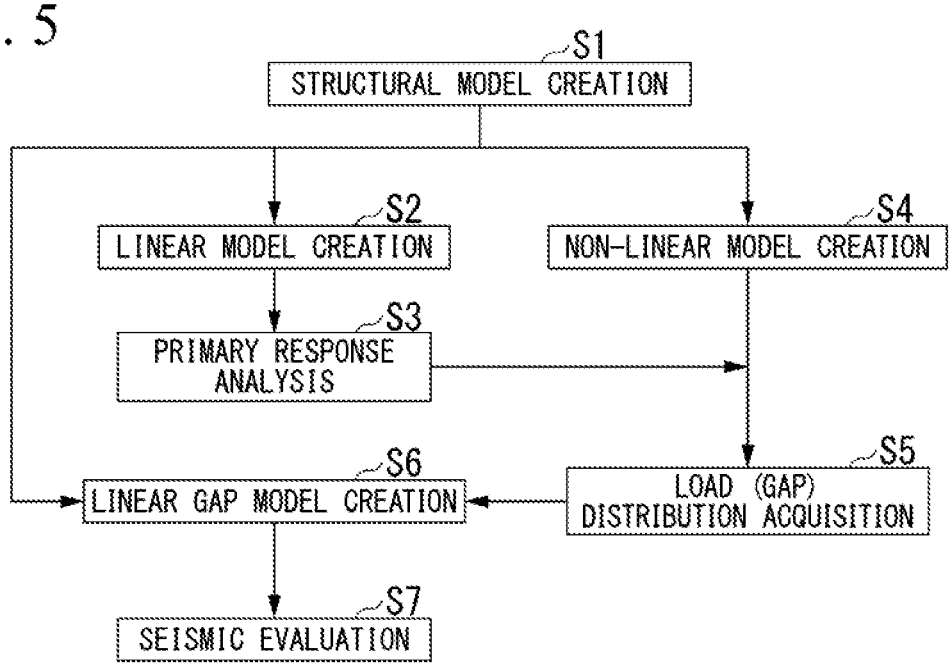
FIG. 5 is a flow chart of a method for analyzing a heat exchanger according to the first embodiment.

Next, a method for analyzing the heat exchanger 20 of the steam generator 1 described above will be described with reference to a flow chart shown in FIG. 5.

The method for analyzing according to the embodiment includes a structural model creation step S1, a linear model creation step S2, a primary response analysis step S3, a non-linear model creation step S4, a load distribution acquisition step S5, a linear gap model creation step S6, and a seismic evaluation step S7.

<Structural Model Creation Step>

Figure 6:
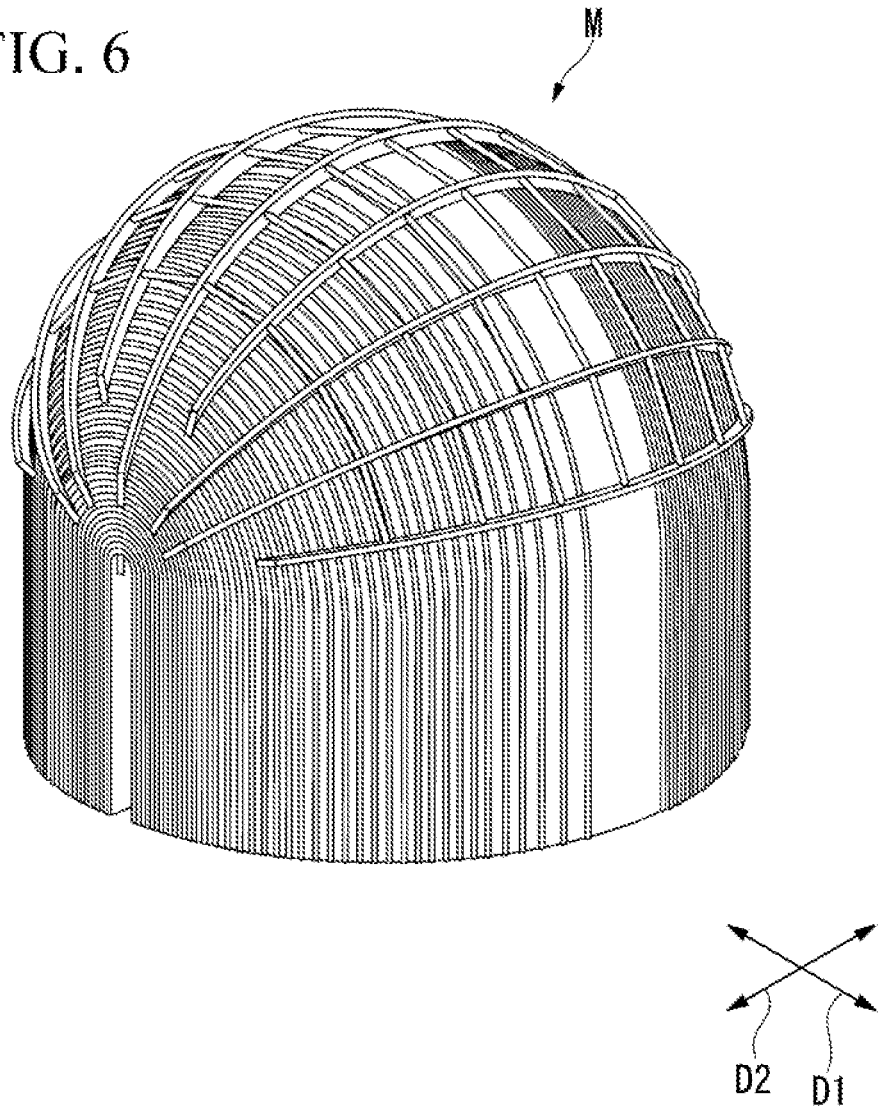
FIG. 6 is a perspective view of a structural model in the method for analyzing a heat exchanger according to the first embodiment.

In the structural model creation step S1, a structural model M of the heat exchanger 20, which is shown in FIG. 6, is created. That is, configuring component models that are obtained by simulating the heat transfer tubes 15, the anti-vibration members 12, the holding members 13, and the bridges 14, which are configuring components of the heat exchanger 20, are combined according to drawing data of the heat exchanger 20, and thereby the structural model M, which is an FEM model of the entire heat exchanger 20, is created.

Specifically, in the structural model creation step S1, a computer in which au automatic generation program is incorporated, is used to automatically create the structural model M of the entire tube group (entire upper portion of the heat exchanger 20 including the U-bend portion) according to each of the configuring component models created in advance and the drawing data of the heat exchanger 20.

The drawing data is a design drawing of the heat exchanger 20 in which a position or a posture of a configuring component and a position of a connecting portion between configuring components are set. The drawing data is incorporated in advance in the automatic generation program.

<Linear Model Creation Step>

After the structural model creation step S1, the linear model creation step S2 is performed. In the linear model creation step S2, a linear model is created by applying a linear spring element in the out-of-plane direction D2 to all of opposing portions 25 between the heat transfer tubes 15 and the anti-vibration members 12 in the structural model M.

Figure 7:
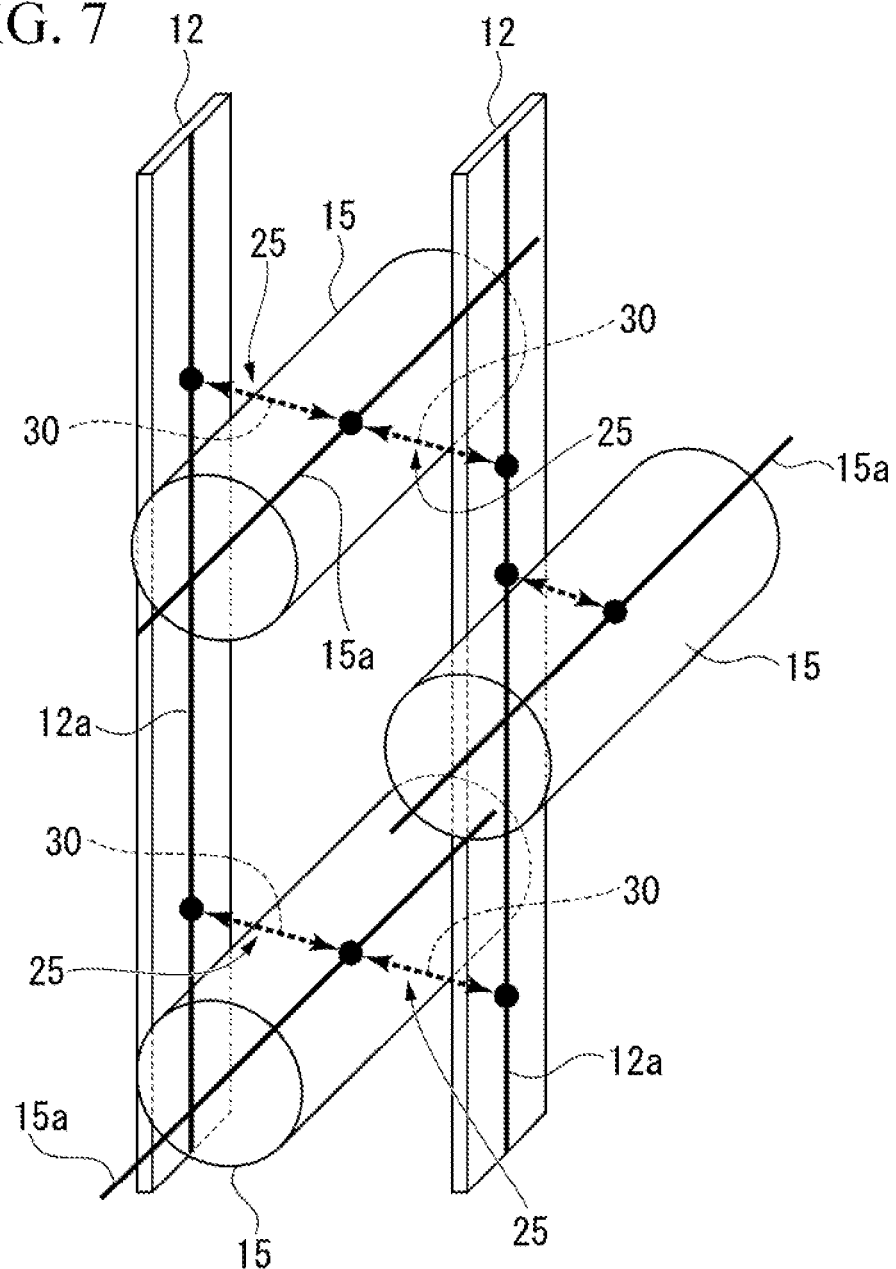
FIG. 7 is a partial perspective view showing a state where a linear spring element or a non-linear spring element is applied to an opposing portion between a heat transfer tube and an anti-vibration member of the structural model in the method for analyzing a heat exchanger according to the first embodiment.

Herein, a relative position relationship between the heat transfer tube 15 and the anti-vibration member 12 in the structural model M is as shown in FIG. 7. That is, the heat transfer tubes 15, which are disposed between a pair of anti-vibration members 12 adjacent to each other in the out-of-plane direction D2, extend to intersect a direction where the anti-vibration members 12 extend, and the heat transfer tubes 15 are disposed between the pair of anti-vibration members 12 between which the heat transfer tubes 15 are interposed with a gap from the out-of-plane direction D2. The heat transfer tubes 15 oppose the anti-vibration members 12 in the out-of-plane direction D2 via the gap. Each of the opposing portions 25 between the heat transfer tube 15 and the anti-vibration member 12 is a portion indicating the shortest distance between the heat transfer tube 15 and the anti-vibration member 12 in the out-of-plane direction D2.

Figure 8:
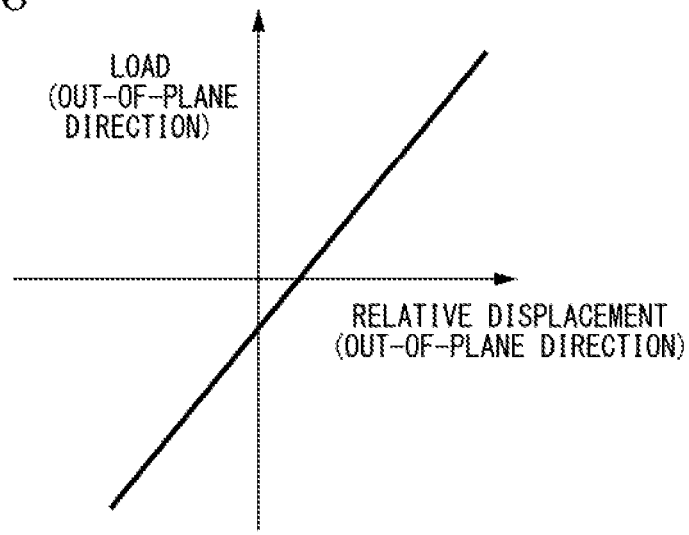
FIG. 8 is a graph showing a relationship between relative displacement and a load of the linear spring element in the out-of-plane direction according to the first embodiment.

In the linear model creation step S2, the linear spring element in the out-of-plane direction D2, which is joined to the heat transfer tube 15 and the anti-vibration member 12, is applied to all of the opposing portions 25 in the structural model M. As shown in FIG. 8, the linear spring element is a spring element having a load-displacement characteristic indicating a linear relationship between a load and relative displacement. A characteristic line of the linear spring element has a linear shape indicating that a load increases as well with an increase in relative displacement. Herein, the load in FIG. 8 indicates a load acting between the heat transfer tube 15 and the anti-vibration member 12. In addition, the relative displacement indicates relative displacement between the heat transfer tube 15 and the anti-vibration member 12. Relative displacement in a case where the heat transfer tube 15 and the anti-vibration member 12 are at initial positions (positions on design data, that is, positions on the structural model M in which an external force is not exerted) is set as a reference value "0" for the linear spring element. A state where the heat transfer tubes 15 and the anti-vibration member 12 are closer to each other than the reference value is set as positive, and a state where the heat transfer tube 15 and the anti-vibration member 12 an more separated away from each other than lire reference value is set as negative.

As described above, since the gap exists between the heat transfer tube 15 and the anti-vibration member 12, the heat transfer rube 15 does not come into contact with (the anti-vibration member 12 in a case where relative displacement is in a range of 0 to a predetermined positive value. For this reason, as shown in FIG. 8, a characteristic line of the load-displacement characteristic of the linear, spring element has a linear shape displaced in a positive direction of the relative displacement, which is the horizontal axis, without passing through the origin. That is, the load-displacement characteristic of the linear spring element includes an element (gap element) according to the gap described above.

In addition, as shown in FIG. 7, in the structural model M, the heat transfer tube 15 may be set as a one-dimensional element 15a extending along the heat transfer tube 15, or the anti-vibration member 12 may be shown as a one-dimensional element 15b extending in a direction where line segments extending along the anti-vibration members 12 extend. In addition, in the linear model creation step S2, the opposing portion 25 between the heat transfer tube 15 and the anti-vibration member 12 may be shown as a one-dimensional element 30 passing through the shortest distance between the heat transfer tube 15 and the anti-vibration member 12. The one-dimensional element 30 indicating the opposing portion 25 may be set to the linear spring element in the out-of-plane direction D2, which is shown in FIG. 8.

As described above, the linear model is created by applying the linear spring element in the out-of-plane direction D2 to the opposing portion 25 between the heat transfer tube 15 and the anti-vibration member 12 in the structural model M.

<Primary Response Analysis Step>

After the linear model creation step S2, the primary response analysis step S3 is performed. In the primary response analysis step S3, response analysis of applying a seismic wave to the linear model is performed to acquire a deformation amount of the linear model.

That is, in the primary response analysis step S3, a seismic wave (earthquake acceleration) is applied to the linear model, seismic wave time history response analysis (dynamic analysis) is performed to obtain a response waveform of displacement. The seismic wave herein is a seismic wave corresponding to au earthquake to be actually evaluated. In addition, since a primary made is superior to a higher order mode at the time of an actual earthquake, the response analysis is performed in consideration of only the primary mode.

According to the response waveform, for example, the maximum displacement of the linear model in the out-of-plane direction D2 as a whole is acquired as a primary expected deformation amount. The strain of the entire heat exchanger 20 is acquired from the response waveform, and the strain may be set as a deformation amount.

<Non-Linear Model Creation Step>

Next, the non-linear model creation step S4 is performed. The non-linear model creation step S4 may be performed in parallel with the linear model creation step S2 and the primary response analysis step S3 after the structural model creation step S1, or may be performed before or after the linear model creation step S2 and the primary response analysis step S3.

In the non-linear model creation step S4, a non-linear model is created by applying a non-linear spring element in the out-of-plane direction D2 to the opposing portion 25 between the heat transfer tube 15 and the anti-vibration member 12 in the structural model M shown in FIG. 7. In the embodiment, the non-linear spring element in the out-of-plane direction D2, which is joined to the heat transfer tubes 15 and the anti-vibration member 12, is applied to all of the opposing portions 25. That is, while the linear spring element is set in the opposing portion 25 of the structural model M in the lineal model creation step S2, the non-linear spring element is set in the opposing portion 25 of the structural model M in the non-linear model creation step S4.

Figure 9:
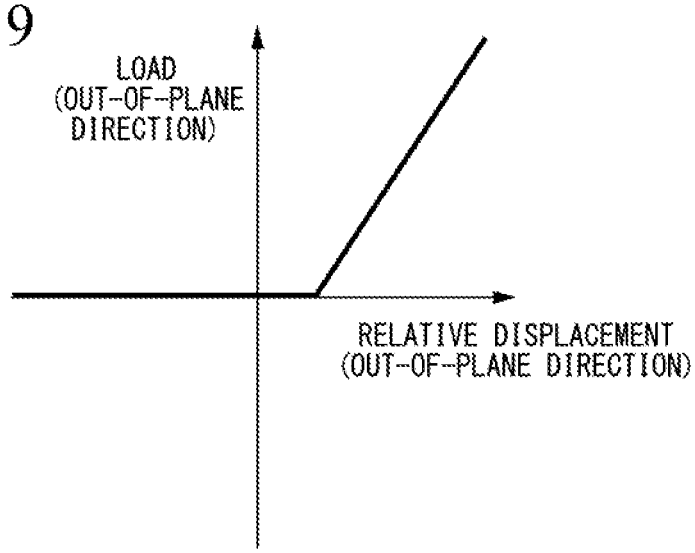
FIG. 9 is a graph showing a relationship between relative displacement and a load of the non-linear spring element in the out-of-plane direction according to the first embodiment.

As shown in FIG. 9, the non-linear spring element is a spring element having a load-displacement characteristic indicating a non-linear relationship between a load and relative displacement. The definition of the load and the definition of the relative displacement shown in FIG. 9 are the same as in the linear spring element shown in FIG. 8.

The load-displacement characteristic of the non-linear spring element is as follows. In a case where relative displacement is negative, and a case where the relative displacement is in a range of 0 to a predetermined positive value, a value of a load is 0. On the other hand, in a case where relative displacement exceeds the predetermined positive value, a linear shape is formed, in which the relative displacement and the load are in a positive correlation. Accordingly, the non-linear spring element simulates the actual behavior of the heat exchanger 20 in which a load is not generated at the time of non-contact between the heat transfer tube 15 and the anti-vibration member 12 and a load is generated only at the time of contact. A load increases with an increase in relative displacement only after reaching the predetermined positive value since the load-displacement characteristic of the non-linear spring element includes a gap element as in the linear spring element. Accordingly, the actual behavior in which a load is generated only after displacement takes place until the gap between the heat transfer tube 15 and the anti-vibration member 12 disappears is simulated.

As described above, the non-linear model is created by applying the non-linear spring element in the out-of-plane direction D2 to the opposing portion 25 between the heat transfer tube 15 and the anti-vibration member 12 in the structural model M.

<Load Distribution Acquisition Step>

After the primary response analysis step S3 and the non-linear model creation step S4, the load distribution acquisition step S5 is performed. In the load distribution acquisition step S5, analysis (static analysis) of applying medial acceleration (load) to the non-linear model is performed to acquire load distribution of the beat exchanger 20 from a value of a load in each of the opposing portions 25. At the same time, in the load distribution acquisition step S5, gap distribution of the opposing portions 25 of the entire heat exchanger 20 can be acquired. That is, as a result of acquiring the load distribution, a portion, in which a load is 0, out of the respective opposing portions 25, can be considered that the heat transfer tube 15 and the anti-vibration member 12 are not in contact with each other and thus a gap is generated. Therefore, gap distribution can be acquired at the same time with the load distribution.

Figure 10:
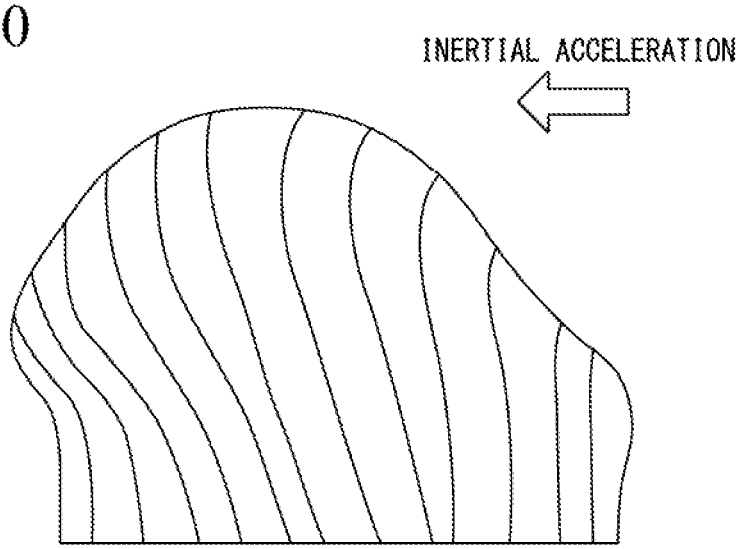
FIG. 10 is a schematic view of a non-linear model at the time of deformation according to the first embodiment, which is seen in the out-of-plane direction.

In the load distribution acquisition step S5, response analysis (static analysis) when inertial acceleration in the out-of-plane direction D2 is applied to the non-linear model is performed. In the analysis, inertial acceleration is applied such that a deformation amount of the non-linear model at the time of deformation, winch is shown in FIG. 10, matches the deformation amount acquired in the primary response analysis step S3, that is, the deformation amount of the linear model with respect to a seismic wave. In addition, the analysis is performed in consideration of only the primary mode for the same reason as the primary response analysis.

Herein, since inertial acceleration acts on mass at the time of an earthquake in general deformation in a case where inertial acceleration acts in the out-of-plane direction D2 is similar to deformation in the out-of-plane direction D2 in the primary mode at the time of an earthquake. For this reason, the deformation amount when inertia; acceleration in the out-of-plane direction D2 is applied to the non-linear model approximates to the deformation amount in the out-of-plane direction D2 in the primary mode at the time of an earthquake. Therefore, by applying inertial acceleration such that the deformation amount of the non-linear model matches the deformation amount of the linear model, data corresponding to a response of the non-linear model with respect to a seismic wave can be acquired. From a non-linear model deformation state according to the result of the response analysis, a load in each of the opposing portions 25 when the non-linear model has deformed in the primary mode can be acquired. The load is a load generated by the hear transfer tube 15 coming into contact with the anti-vibration member 12 in the out-of-plane direction D2 due to the deformation of the heat exchanger 20.

Figure 11:
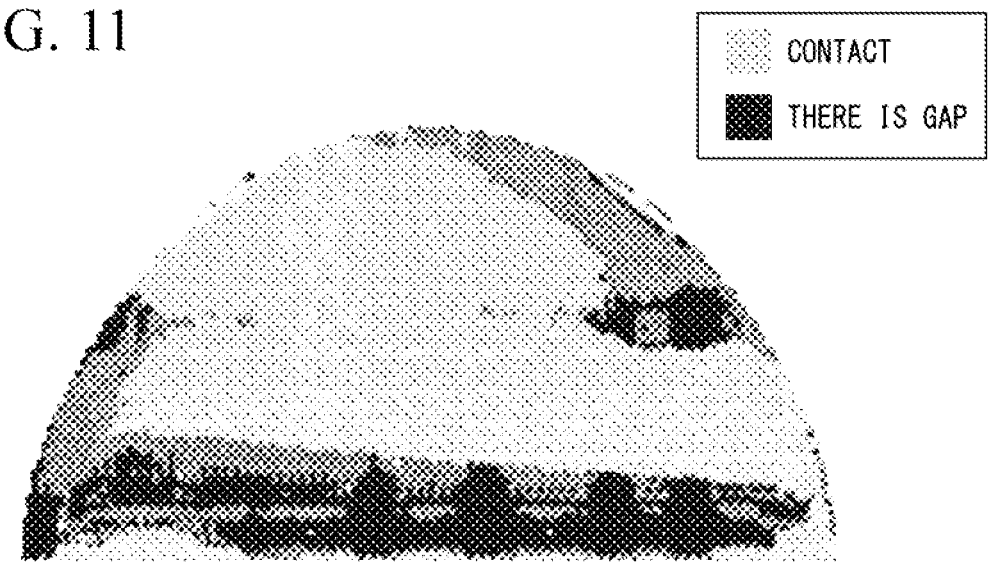
FIG. 11 is a view of gap distribution of a heat exchanger according to the first embodiment.

Accordingly the load distribution of each of the opposing portions 25 of the entire heat exchanger 20 can be acquired. In addition, a portion in which a load is not generated, out of the respective opposing portions 25, indicates that the heat transfer tube 15 and the anti-vibration member 12 are in a non-contact state. For this reason, as shown in FIG. 11, the gap distribution of each of the opposing portions 25 of the entire heat exchanger 20 can be acquired.

<Linear Gap Model Creation Step>

After the load distribution acquisition step S5, the linear gap model creation step S6 is performed. In the linear gap model creation step S6, a linear gap model, in which the linear spring element in the out-of-plane direction D2 is applied only to the opposing portion 25 in which a load is generated out of the opposing portions 25 of the structural model M, is created according to the load distribution or the gap distribution.

Specifically, from the load distribution or the gap distribution acquired in the load distribution acquisition step S5, each of the opposing portions 25 is classified into two groups including a portion in which a gap is generated (a portion in which a load is 0) and a portion in which a gap is not generated (a portion in which a load is generated). A linear gap model is created by setting the linear spring element shown in FIG. 8, which is the same as in the linear model creation step S2, in a portion in which a gap is not generated, out of the opposing portions 25, with respect to the structural model M.

Since a load is not generated in a portion where the heat transfer tube 15 and the anti-vibration member 12 are not in contact with each other in the first place, out of the respective opposing portions 25, the setting of the linear spring element is unnecessary. For this reason, the linear spring element is not set in the non-contact portion in the linear gap model.

<Seismic Evaluation Step>

After die linear gap model creation step S6, seismic evaluation is performed on the linear gap model. Specifically, seismic wave time history response analysis, which is eigenvalue analysis or dynamic analysis, is executed on the linear gap model to evaluate the earthquake resistance of the linear gap model as the earthquake resistance of the heat exchanger 20.

As described above, in the method for analyzing according to the embodiment, distribution of a load exerted by the heat transfer tube 15 and the anti-vibration member 12 on each other and gap distribution can be learned by performing response analyst on an analysis model (non-linear model) to which the non-linear spring simulating the behavior at the time of contact and non-contact between the heat transfer tube 15 and the anti-vibration member 12 is applied.

In addition, since seismic evaluation is performed on only a portion in contact, out of the opposing portions 25 between the heat transfer tubes 15 and the anti-vibration members 12, with the linear gap model to which the linear spring element is applied as an analysis target, the evaluation can be accurately performed.

That is, for example, when the linear spring element shown in FIG. 8 is applied to all of the opposing portions 25 between the heat transfer tubes 15 and the anti-vibration members 12 in the structural model M, a tension load is generated even in a case where gaps are generated between the heat transfer tubes 15 and the anti-vibration members 12. In this case, an analysis accuracy decrease is caused by showing behavior different from the actual behavior of the heat exchanger 20.

On the contrary, in the method for analyzing according to the embodiment, according to the load distribution or the gap distribution, the linear spring element is not applied to a portion in which a load is 0 (portion in non-contact), out of the opposing portions 25 between the heat transfer tubes 15 and the anti-vibration members 12, and the linear spring element is applied to only a portion in which a load is generated (portion in contact). Accordingly, behavior even closer to the actual behavior of the heat transfer tubes 15 and the anti-vibration members 12 of the heat exchanger 20 can be simulated. That is, even in a case where a gap is generated between the heat transfer tube 15 and the anti-vibration member 12, tension is not generated therebetween. Therefore, an analysis result does not significantly break away from the actual heat exchanger 20.

In addition, in the embodiment, the linear model or the linear cap model to which only a linear element is applied is used in the steps (the primary response analysis step S3 and the linear gap model creation step S6) in which dynamic analysis of applying a seismic wave is performed, and the non-linear model to which a non-linear element is applied is used in the step (the load distribution acquisition step S5) in which static analysis of applying inertial acceleration is performed. Since the analysis model to which only the linear element is applied is used in dynamic analysis, which is a complicated analysis, analysis time does not extend. Since only static analysis, in which calculation is easy compared to dynamic analysis, is performed on the analysis model to which the non-linear element is applied, the extension of analysis time can be suppressed. Therefore, the entire analysis can be performed in a short period of time.

Next, a second embodiment of the present invention will be described. In the second embodiment, the same configuration elements as the first embodiment will be assigned with the same reference signs, and the detailed description thereof will be omitted.

Figure 12:
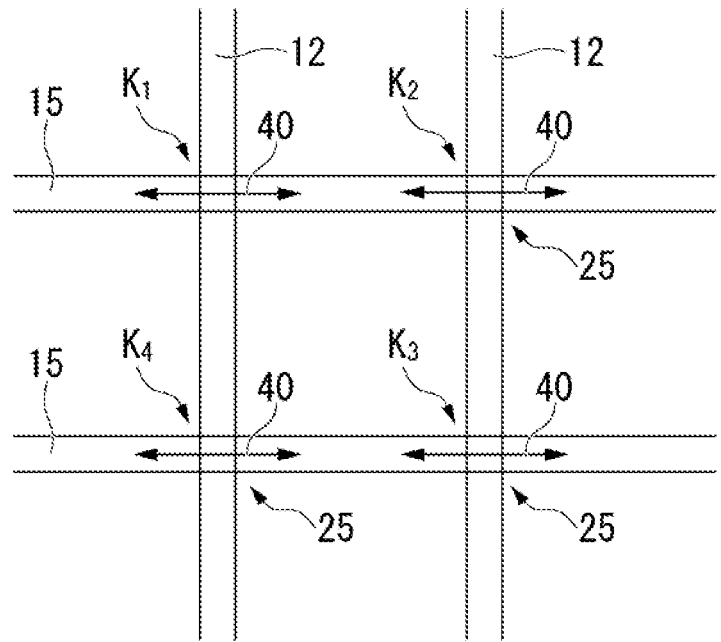
FIG. 12 is a schematic view showing friction acting on a heat transfer tube and an anti-vibration member of a heat exchanger in an out-of-plane direction according to a second embodiment.

In the second embodiment, in the linear gap model creation step S6, a linear spring element 40 in the in-plane direction D1, which is joined to the heat transfer rube 15 and the anti-vibration member 12, is applied to each of the opposing portions 25 between the heat transfer rubes 15 and the anti-vibration members 12 in the linear gap model of the first embodiment, as shown in FIG. 12. The linear spring element 40 is an element simulating friction in the in-plane direction D1, which occurs when the heat transfer tube 15 and the anti-vibration member 12 are in contact with each other.

Figure 13:
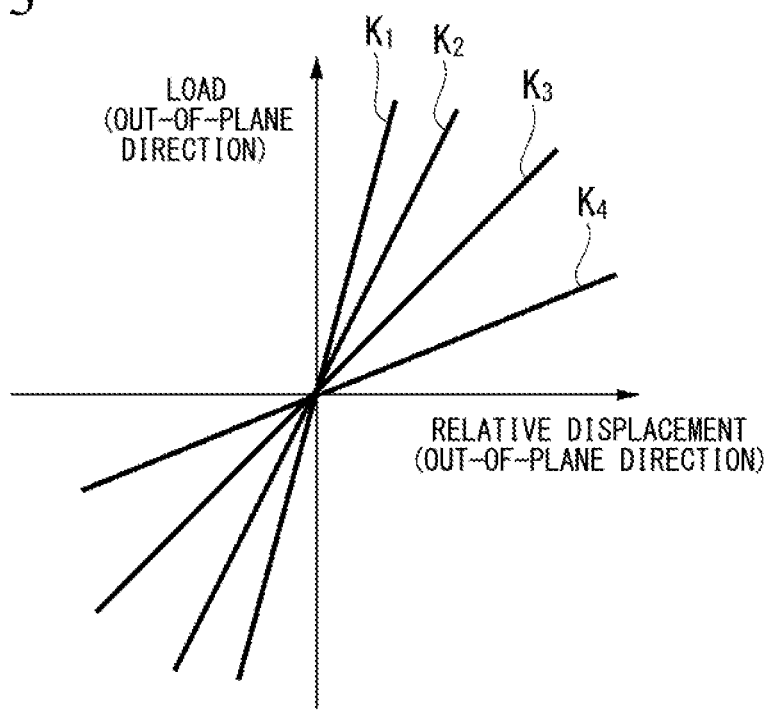
FIG. 13 is a graph showing a relationship between relative displacement and a load of a linear spring element in an in-plane direction according to the second embodiment.

The elastic stiffness of the linear spring element 40 in the in-plane direction D1 is determined according to the value of the load in each of the opposing portions 25 acquired in the load distribution acquisition step S5. That is, in a case where the heat transfer tube 15 and the anti-vibration member 12 are in a contact with each other in the in-of-plane direction D1 at a predetermined load, a value obtained by multiplying the load by a coefficient of friction is friction between the heat transfer tube 15 and the anti-vibration member 12. The friction corresponds to elastic stiffness when relatively moving in the out-of-plane direction D2 in a state where the heat transfer tube 15 and the anti-vibration member 12 are in contact with each other. Therefore, the load-displacement characteristics in the respective opposing portions 25, each of which is a relationship between a load in the out-of-plane direction D2 and relative displacement in the out-of-plane direction D2. have linear shapes having elastic stiffness $K_1$, elastic stiffness $K_2$, elastic stiffness $K_3$, and elastic stiffness $K_4$ respectively corresponding to loads in the opposing portions 25, as shown in FIG. 13. The linear spring element in the in-plane direction D1 in each of the opposing portions 25 can be made as each model of a single degree of freedom system.

As in the first embodiment, the seismic evaluation step S7 is executed on such a linear cap model. Accordingly response analysis in consideration of friction exerted by the heat transfer tube 15 and the anti-vibration member 12 on each other in the in-plane direction D1 can be performed. Therefore, analysis approximating to the more actual behavior of the heat exchanger 20 can be performed, and thus the accuracy of seismic evaluation can be further improved.

Although the embodiments of the present invention are described, the present invention is not limited thereto, and can be modified as appropriate without departing from the technical scope of the invention.

For example, although analysis is performed in consideration of only the primary mode in the primary response analysis step S3, an evaluation mode may be selected after eigenvalue analysis is performed on the linear model, and response analysis may be performed in consideration of the selected mode.

In the primary response analysis step S3, not only analysis of applying inertial acceleration, but also analysis of acquiring a deformation amount by applying a load other than inertial acceleration may be performed.

In addition, although an example in which the method for analyzing according to the present invention is applied to the heat exchanger 20 of the steam generator 1 is described in the embodiments, the method for analyzing may be applied to another heat exchanger 20.

INDUSTRIAL APPLICABILITY

The present invention is applicable to a method for analyzing a heat exchanger.

REFERENCE SIGNS LIST

1: steam generator
2: drum unit
3: tube group outer shell
10: U-bend portion
11: heat exchanger main body
12: anti-vibration member
12a: fixing portion
13: holding member
14: bridge
15: transfer tube
15a, 15b, 30: one-dimensional element
15U: bend portion
16: heat transfer tube group
20: beat exchanger
21: water chamber
22: team discharge port
23: tube support plate
25: opposing portion
40: linear spring element
S1: structural model creation step
S2: linear model creation step
S3: primary response analysis step
S4: non-linear model creation step
S5: load distribution acquisition step
S6: linear gap model creation step
S7: seismic evaluation step
D1: in-plane direction
D2: out-of-plane direction
M: structural model

What is claimed is:
1. A method for analyzing a heat exchanger having a heat exchanger main body formed by a plurality of heat transfer tube groups, each of which is formed of a plurality of heat transfer tubes arranged side by side in an in-plane direction, being stacked in an out-of-plane direction intersecting the in-plane direction and an anti-vibration member provided between the heat transfer tube groups adjacent to each other to extend to intersect the heat transfer tubes, the method comprising:

a structural model creation step of creating a structural model of the heat exchanger;

a non-linear model creation step of creating a non-linear model in which a non-linear spring element in the out-of-plane direction, in which a load is not generated at the time of non-contact between the heat transfer tube and the anti-vibration member and a load is generated at the time of contact, is applied to each of opposing portions between the heat transfer tubes and the anti-vibration member in the out-of-plane direction in the structural model; and a load distribution acquisition step of performing analysis in which the load in the out-of-plane direction is applied to the non-linear model to acquire load distribution of the heat exchanger from a value of the load in each of the opposing portions.

2. The method for analyzing a heat exchanger according to claim 1, further comprising:

a linear gap model creation step of creating a linear gap model in which a linear spring element in the out-of-plane direction is applied to only the opposing portion in which the load is generated, out of the opposing portions of the structural model, according to the load distribution; and a seismic evaluation step of performing seismic evaluation by using the linear gap model.

3. The method for analyzing a heat exchanger according to claim 2, wherein in the linear gap model creation step, the linear gap model is created by further applying a linear spring element in the in-plane direction to each of the opposing portions in the structural model using a value that is determined according to the value of the load in each of the opposing portions acquired in the load distribution acquisition step as elastic stiffness.

4. The method for analyzing a heat exchanger according to claim 1, further comprising:

a linear model creation step of creating a linear model in which a linear spring element in the out-of-plane direction is applied to all of the opposing portions of the structural model; and a primary response analysis step of performing response analysis in which a seismic wave is applied to the linear model to acquire a deformation amount of the linear model, wherein in the load distribution acquisition step, a load is applied to the non-linear model such that a deformation amount of the non-linear model becomes a value corresponding to the deformation amount acquired in the primary response analysis step.

\* \* \* \* \*